United States Patent [19]

Butt

[11] Patent Number: 4,569,692
[45] Date of Patent: Feb. 11, 1986

[54] LOW THERMAL EXPANSIVITY AND HIGH THERMAL CONDUCTIVITY SUBSTRATE

[75] Inventor: Sheldon H. Butt, Godfrey, Ill.

[73] Assignee: Olin Corporation, New Haven, Conn.

[21] Appl. No.: 539,449

[22] Filed: Oct. 6, 1983

[51] Int. Cl.$^4$ .............................................. C22C 29/12
[52] U.S. Cl. .......................................... 75/235; 75/230; 148/127; 428/212; 428/426; 428/457; 428/546; 428/548; 428/551; 428/570; 428/616; 428/618; 428/620; 428/688; 428/704; 428/901; 501/153; 501/154; 427/82; 427/93; 427/96
[58] Field of Search ............... 148/127; 428/548, 212, 428/546, 551, 570, 616, 618, 620, 426, 457, 688, 704, 901; 75/230, 235; 427/82, 93, 96; 501/153, 154

[56] References Cited

U.S. PATENT DOCUMENTS

| | | | |
|---|---|---|---|
| 3,097,329 | 7/1963 | Siemens | 317/254 |
| 3,306,715 | 2/1967 | Schlomer et al. | 75/230 |
| 3,900,601 | 8/1975 | Franz et al. | 427/123 |
| 4,061,801 | 12/1977 | Hamada et al. | 428/548 |
| 4,125,646 | 11/1978 | Dean et al. | 327/253 |
| 4,320,412 | 3/1982 | Hynes et al. | 350/70 |
| 4,334,926 | 6/1982 | Futamura et al. | 75/230 |
| 4,341,841 | 7/1982 | Ohno et al. | 428/450 |
| 4,360,702 | 11/1982 | Feng et al. | 357/30 |

FOREIGN PATENT DOCUMENTS

| | | | |
|---|---|---|---|
| 448683 | 5/1948 | Canada | 148/127 |
| 47526 | 4/1977 | Japan | 428/548 |

*Primary Examiner*—Stephen J. Lechert, Jr.
*Attorney, Agent, or Firm*—Howard M. Cohn; Barry L. Kelmachter; Paul Weinstein

[57] ABSTRACT

A composite is provided which is adaptable to be a substrate for an electronic application. The composite comprises first material particles having a coefficient of thermal expansion in the range of about $-20\times10^{-7}$ to about $50\times10^{-7}$ in/in/°C. Second material particles having a coefficient of thermal expansion in the range of about $100\times10^{-7}$ to about $200\times10^{-7}$ in/in/°C. are mixed with the first material particles. A bonding agent adheres the first and second material particles into a coherent composite having a coefficient of thermal expansion in the range of about $1\times10^{-7}$ to about $50\times10^{-7}$ in/in/°C.

24 Claims, No Drawings

LOW THERMAL EXPANSIVITY AND HIGH THERMAL CONDUCTIVITY SUBSTRATE

While the invention is subject to a wide range of applications, it is especially suited for use as a substrate for microelectronics and printed circuits. The invention is primarily concerned with bonding together materials having different thermal expansivities and thermal conductivities to form a coherent composite with desired properties tailored for individual applications.

Low expansivity materials are widely used in the microelectronic industry as substrate materials for individual packages, multi-device hybrid circuit packages and printed circuit boards. The latter applications are particularly useful when the coefficient of thermal expansion of the printed circuit board is critical, i.e. when silicon chips or low expansivity leadless chip carriers are mounted on the board.

In many instances, state of the art, low expansivity, ceramic and metallic substrate materials may be replaced by relatively high expansivity metals. Examples of these replacements are described in U.S. patent application Ser. Nos. 369,699, now U.S. Pat. No. 4,491,622, 369,785, (now abandoned), 390,081, (now abandoned), 390,095, now U.S. Pat. No. 4,410,927, 398,497, now U.S. Pat. No. 4,480,262, 405,640, (now abandoned), 454,409, 477,552 and 517,592 all of which are by the same inventor, Sheldon H. Butt, and commonly assigned with the present application. These patent applications generally describe the use of high expansivity metallic materials in combination with appropriately selected high expansivity glasses or organic adherents. The mismatch in coefficient of thermal expansion between these combinations of materials and silicon based microelectronic components is accommodated by mounting systems such as adhesives or solders which prevent the development of unacceptably high stresses upon the fragile and brittle silicon components. However, for some applications it may not be feasible to provide component mounting systems with silicon chips which can accommodate the potential coefficient of thermal expansion mismatch stresses inherent with copper and copper alloy substrates. To better appreciate the advantages of the materials of the present invention, a fuller description of the limitations of the conventional substrate materials mentioned above follows.

Alumina ceramics are presently the most widely used substrate materials. There is a moderate mismatch between the coefficient of thermal expansion of alumina and silicon which generally does not impose unacceptable high stresses upon a silicon chip mounted on an alumina substrate and subjected to thermal cycling. The mismatch does not even pose a particular problem when the chip sizes are quite large or when the chip is rigidly affixed to the substrate. The use of alumina ceramics as substrate material is particularly attractive since they are somewhat less costly than most other presently available, low expansivity substrate materials. However, there are a number of drawbacks to these materials such as the thermal conductivity of alumina ($Al_2O_3$) being poor, i.e. in the range of about 4 $BTU/ft^2/hr/°F$. Also, because of present manufacturing capabilities, alumina substrate areas greater than about 50 sq. in. are uncommon. Further, to add conductive circuitry to the surface of alumina, thick film technology such as printing circuitry upon the surface of the ceramic with a conductive ink is frequently used. The printed ink, usually precious metal based, is subsequently fired at elevated temperatures and consolidated into continuous conductors. Efforts to substitute copper based thick film inks for silver and gold based inks have been only partially successful. The inherent high cost of the materials and the tedious and costly processing involved in generating circuitry upon the alumina substrate surface results in the alumina substrates being a relatively costly article.

Beryllia ceramics, having a thermal conductivity of about 125 $BTU/ft^2/hr/°F$. at 100° F., are used in the place of alumina ceramics in applications requiring greater thermal conductivity than is available with alumina. The inherent high cost of beryllium results in these substrates being very expensive. The same thick film printing and firing technology used with alumina is also required for beryllia. One further and unique disadvantage of using beryllia substrates is the toxicity of beryllium. This problem may be solved by cautious handling and very careful dust control. However, even with high material costs, high processing costs and toxicity control problems, beryllia substrates are often used when enhanced thermal conductivity is required.

Molybdenum strip metal, having a thermal conductivity of about 820 $BTU/ft^2/hr/°F$. at 68° F., is sometimes used as a substrate material, particularly in hybrid circuit packages. Although expensive and difficult to process, molybdenum does provide high thermal conductivity in association with a low coefficient of thermal expansion, i.e. $32 \times 10^{-7}$ in/in/°F. at 68° to 1060° F. A serious drawback to the use of molybdenum components is the particular difficulty in processing because of its poor oxidation resistance.

The use of special clad metals and substrate materials for low expansivity printed circuit board substrates has been described in some of the patent applications described hereinabove. These concepts generally include cladding a high conductivity, high thermal expansivity copper or copper alloy to a very low thermal expansivity nickel-iron alloy (such as INVAR). The resulting composite has a coefficient of thermal expansion comparable to that of alumina and beryllia ceramics. The purpose of cladding with copper or copper alloy is to improve the normally poor thermal conductivity of nickel-iron alloys. Because of the characteristics of the composite, the improved thermal conductivity is primarily obtained in a plane extending longitudinally with the length and width of the substrate. However, the thermal conductivity through the thickness of the composite metal remains relatively poor because of the poor thermal conductivity through the nickel-iron alloy core. The cost of the nickel-iron alloys and the relatively costly process involved in manufacturing clad metals results in these substrate materials being relatively expensive although less than comparable beryllia or molybdenum substrates.

Several other techniques have been taught by the prior art to accommodate mismatched expansion coefficients as disclosed in U.S. Pat. Nos. 3,097,329 to Siemens and 4,320,412 to Hynes et al.

It is a problem underlying the present invention to reduce the mismatch in the coefficient of thermal expansion between microelectric components and substrates to which they are mounted while concurrently providing relatively high thermal conductivity.

It is an advantage of the present invention to provide a composite which obviates one or more of the limitations and disadvantages of the described prior arrangements.

It is a further object of the present invention to provide a composite which substantially reduces the formation of stresses between microelectronics and printed circuit boards to which they are mounted due to mismatch between the coefficients of thermal expansion.

It is a still further advantage of the present invention to provide a composite which is adapted to be a printed circuit board having adequate strength and thermal shock resistance.

It is another advantage of the present invention to provide a composite which may be either electrically conductive or electrically non-conductive.

It is a yet further advantage of the present invention to provide a composite which is relatively inexpensive to manufacture.

Accordingly, there has been provided a composite which is adaptable to be a substrate for an electronic application. The composite comprises first material particles having a coefficient of thermal expansion in the range of about $-20 \times 10^{-7}$ to about $50 \times 10^{-7}$ in./in./°C. Second material particles having a coefficient of thermal expansion in the range of about $100 \times 10^{-7}$ to about $200 \times 10^{-7}$ in/in/°C. are mixed with the first material particles. A bonding agent adheres the first and second material particles into a coherent composite having a coefficient of thermal expansion in the range of about $1 \times 10^{-7}$ to about $50 \times 10^{-7}$ in/in/°C. and preferably from about $20.3 \times 10^{-7}$ to about $26.3 \times 10^{-7}$ in./in./°C.

The present invention is particularly directed to providing a range of low expansivity, high thermal conductivity, economical composite materials. They may be adapted to be substrates for semiconductor devices, hybrid packages or rigid printed circuit boards. Depending upon their particular composition, they may be either electrically conductive or electrically non-conductive. The basic concept involves mixing together several different materials to provide selected properties. One of the materials is selected from a readily available, very low or negative thermal expansivity material. Such a material, as a class, generally exhibits poor thermal conductivity. Particles of this first material may be mixed with particles of a second highly thermal conductive material which characteristically and as a class exhibits higher thermal expansivity. The second material is chosen to have a higher thermal expansivity than required in the finished product so as to create a blended composite mass with properties selected and tailored to the individual application. A third material bonds the mixture into a coherent mass having adequate strength and being resistant to thermal shock. Developing a mechanically strong, coherent composite mixture must overcome the problem of adhering dissimilar materials together.

The low thermal expansivity particles may be chosen from any conveniently available ceramic or glassy system. These may include materials such as KRYPTONITE ® which is a ceramic manufactured by Owens Illinois that has a negative coefficient of thermal expansion. Other materials include silica, borosilicate glasses and high silica ceramics. The preceding list is intended to be exemplary and it is also within the scope of the present invention to substitute other materials of a ceramic or glassy nature which combine a low coefficient of thermal expansion with other desirable characteristics.

The low thermal expansivity particles may also be produced from low expansivity metals or alloys. These include nickel-iron alloys wherein the nickel is in the range of about 30 to 45% and the remainder is primarily iron; iron, nickel and cobalt alloys; silicon or molybdenum.

The high thermal conductivity component of the composite mass may consist of commercially pure copper, high conductivity copper alloys, aluminum and its alloys, and other metals and metal alloys.

The specific choice of the high thermal conductivity material depends upon the combination of properties desired in the final composite mass. For instance, it may be desirable to have a thermal conductivity in the range of about 65 to 230 BTU/ft$^2$/hr/°F. The electrical conductivity is generally between about 30 to about 100% of the international annealed copper standard (IACS). A degree of strength is required so that the material can be conveniently handled during processing. It may be desirable for the material to have oxidation resistance, specified oxide characteristics, high temperature properties, desired magnetic properties, and other qualities depending upon the individual application.

The composite may be formed into a coherent mass of any desirable shape such as, for example, a strip or sheet. This may be accomplished by mixing the particles of one or more low thermal expansivity materials with particles of one or more high thermal conductivity materials. The mixture is combined with a bonding agent or agents and formed into the desired shape. This composite is then consolidated into a coherent mass by the application of heat, pressure or a combination thereof so that the bonding material adheres to the various components of the mixture. The binding agent may include materials such as glasses, organic adhesives, metals like solder, and ceramics. It is also within the terms of the present invention to use other binding agents which do not interfere with the final requirements of the composite.

Pretreatment of certain component particles may be necessary to promote their adhesion to the binding agent. For example, the low expansivity materials may not be wettable by the process step of material consolidation. These materials may require coating with a layer of metal like copper by any desirable process such as electroless plating. Other possibilities include coating the glass ceramic and metal materials with glass which is wettable by the bonding agent.

The composites of the present invention are broadly formed by mixing first material particles having a coefficient of thermal expansion in the range of about $-20 \times 10^{-7}$ to about $50 \times 10^{-7}$ in/in/°C. with second material particles having coefficient of thermal expansion in the range of about $100 \times 10^{-7}$ to about $200 \times 10^{-7}$ in/in/°C. The mixture is combined with a bonding agent which adheres the entire mass into a coherent composite having a coefficient of thermal expansion in the range of about $1 \times 10^{-7}$ to about $50 \times 10^{-7}$ in/in/°C. The desired range for the coefficient of thermal expansion is chosen to be close to the value of the coefficient of thermal expansion of silicon, i.e. $23.3 \times 10^{-7}$ in/in/°C. For many applications, the composite is formulated to have a thermal expansion close to or the same as silicon. This prevents stress formation from thermal cycling when the composite is used as a substrate with a silicon device attached thereto. The above-described composite broadly forms the present invention and examples of various formulations are provided hereinbelow.

The first example is of a thermally and electrically conductive composite consisting of a low expansivity, electrically non-conductive component in a continuous, predominantly copper matrix. Particles of low expansivity, borosilicate glass, sized between about 0.5 to about 5 mm in diameter, are coated with a metallic lead by a process of electroless deposition. To promote adhesion of the lead to the glass particles, it may be desirable to chemically etch the surface of the glass particles before deposition of the lead. The iron coated glass particles are then mixed together with a binder of lead powder and high expansivity, different sized, copper particles. The proportion of lead and copper is adjusted so that the subsequently melted lead will fill the interstices between the components of the mixture. The mixture is formed by pressure into a sheet and consolidated by heating at a temperature in excess of the lead melting point, i.e. about 618° F., in an atmosphere reducing to copper oxide and lead oxide. The removal of oxide films from the metallic particles is necessary to achieve complete wetting of the copper by the lead. The result is a thermally and electrically conductive composite consisting of a discontinuous phase of glass particles in a matrix consisting of copper particles suspended in a lead matrix. The lead was chosen as a bonding agent because of its relatively low melting point and its low solubility in copper. This avoids the degradation of the electrical and thermal conductivity of the copper particles that could occur with a bonding agent such as a lead-tin alloy in which the tin would diffuse into the copper particle and reduce the electrical and thermal conductivity.

Depending upon the specific constituents, the composite mass may require exposure to a reducing atmosphere at a temperature above the melting point of the lead to remove oxide films from the metallic particles and achieve substantially complete wetting of the copper by the lead.

Accelerated removal of the oxide films from the copper particles may also be achieved by utilizing a lead alloy bonding material which contains an element strongly reducing to copper, i.e. an almost completely lead alloy with calcium. The bonding may also be accelerated by precoating the copper particles with lead or a phosphate coating. The latter coating may be accomplished by applying a phosphoric acid solution containing from about 3.5 grams/liter up to the solubility limit of sodium dichromate ($Na_2Cr_2O_7Ch_2O$) or potassium dichromate ($K_2Cr_2O_7$) or mixtures thereof to the copper alloy material. Other examples of this process are disclosed in U.S. patent application Ser. No. 443,793 to Butt et al. With this precoating, the oxide films on the surface of the copper particles are replaced by polyphosphate films which then dissolve and react with the lead.

Another process step may include increasing the hardness of the lead by suitable alloying means such as the addition of antimony.

After the composite sheet has been formed, additional processing may be desirable in accordance with the use requirements. For example, for microelectronic substrate applications, the surface of the sheet may be dressed by chemical or mechanical means so as to smooth, polish, etc. or remove excess constituents from the surface. The substrate surface may now be in condition to bond thin continuous metal foils such as copper or nickel to its surface by attachment to the lead or lead alloy phase.

Another alternative is to apply a continuous layer of a relatively low melting temperature glass, as compared to the melting temperature of the components of the composition, to the substrate surface. This may be accomplished by bonding the low temperature glass to the exposed glass particles within the substrate. Preferably, the surface of the composite is chemically dressed prior to the addition of the low temperature glass layer by partially removing the metallic phase at the substrate surface. This process step exposes a larger percentage of the glass surface particles within the matrix for adherence to the low temperature glass coating.

Another exemplary embodiment is similar to the first example but with the low melting temperature bonding agent eliminated. The glass or ceramic particles of the low expansivity material may be coated by electroless deposition with copper and mixed with copper powder. The resulting composite is compacted into the desired form and consolidated by sintering in a reducing atmosphere. As above, the reducing atmosphere is required to substantially eliminate the metal oxides which may prevent the wetting of the glass by the copper. This choice of glasses and/or ceramics is limited to those which do not melt at the temperature required to sinter the copper particles together. In cooling the sintered copper particles from the process temperature, substantial internal stresses will develop as a result of the mismatch in the coefficient of thermal expansion of the glass particles and the copper. These stresses may be relieved by slow cooling so that the copper phase creeps and partially relieves these stresses.

Other electroless metal deposits such as silver or copper may be coated on the surface of the glass as an alternative to the copper in order to achieve higher bond strength. The coating material is preferably selected to either diffuse into the copper phase in small quantities and have a minimal effect upon the copper phase or to be relatively insoluble in copper.

The copper particles of this example may be substituted with relatively high strength, high conductivity copper alloy particles. For example, copper-iron alloy particles may be mixed with pure copper particles so that through diffusion during sintering, the entire phase becomes a relatively higher strength copper-iron alloy. Other possibilities include copper alloys such as copper-chromium, copper-zirconium and copper-cobalt.

Another embodiment provides iron particles mixed with the pure copper particles. This has the effect of reducing the average coefficient of thermal expansion of the metallic phase. After sintering, the metallic phase will consist of a mixture of iron-rich particles and copper-rich copper-iron alloy particles. This mixture advantageously provides enhanced strength, relatively higher conductivity and substantial magnetic permeability.

The further embodiment is of an electrically non-conductive, thermally conductive composite. To from this composite, low expansivity glass or ceramic particles are mixed with copper or copper alloy particles. A relatively low temperature melting glass binder (below the melting temperature of the other particles) adheres the mixing into a coherent composite and fills the interstices between particles. The composite is made electrically non-conductive by mixing enough electrically non-conductive, low expansivity particles to create a discontinuous matrix of the metallic particles. Substantial thermal conductivity may be obtained with this composite by limiting the thickness of the glass binder film separating the conductive particles. The improved conductivity can be enhanced by maximizing the metallic particle sizes and by minimizing the amount of low melting temperature binding glass.

The next embodiment is of another thermally conductive, electrically non-conductive composite. This example is substantially the same as the previous example except that an organic polymer such as epoxy, polyimide or a thermosetting organic resin replaces the low temperature melting glass set forth above. As in the previous example, the thermal conductivity can be enhanced by minimizing the amount of the polymer binder and maximixing the metallic particle size.

The patents and patent applications set forth in this application are intended to be incorporated by reference herein.

It is apparent that there has been provided a low thermal expansivity and high thermal conductivity substrate which is adaptable to be a substrate for an electronic application which fully satisfies the objects, means, and advantages set forth hereinabove. While the invention has been described in combination with the specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A composite adapted to be a substrate for an electronic application, comprising a mixture of:
   first material particles having a coefficient of thermal expansion in the range of about $-20 \times 10^{-7}$ to about $50 \times 10^{-7}$ in/in/°C.;
   second material particles mixed with said first material particles having a coefficient of thermal expansion in the range of about $100 \times 10^{-7}$ to about $200 \times 10^{-7}$ in/in/°C.; and
   a bonding agent to adhere the first and second material particles into a coherent composite having a coefficient of thermal expansion in the range of about $1 \times 10^{-7}$ to about $50 \times 10^{-7}$ in/in/°C.

2. A composite as in claim 1 wherein said composite has a thermal conductivity in the range of about 65 to 230 BTU/ft/ft$^2$/hr/°F.

3. A composite as in claim 2 wherein said first material are particles selected from the group consisting of silica, ceramics, glass, metals and metal alloys.

4. A composite as in claim 3 wherein said first material is a ceramic.

5. A composite as in claim 3 wherein said first material is a silica.

6. A composite as in claim 3 wherein said first material is a glass.

7. A composite as in claim 1 wherein said bonding agent fills the interstices between the first and second material particles.

8. A composite as in claim 3 wherein said first material is a metal alloy.

9. A composite as in claim 8 wherein said first material is a nickel-iron alloy.

10. A composite as in claim 8 wherein said first material is an iron-nickel-copper alloy.

11. A composite as in claim 8 wherein said first material is molybdenum.

12. A composite as in claim 3 wherein said second material is selected from the group consisting of metals and metal alloys.

13. A composite as in claim 12 wherein said second material is copper.

14. A composite as in claim 12 wherein said second material is a copper alloy.

15. A composite as in claim 12 wherein said second material is aluminum.

16. A composite as in claim 12 wherein said second material is an aluminum alloy.

17. A composite as in claim 12 wherein said bonding agent is selected from the group consisting of glasses, organic adhesives, ceramics and metals.

18. A composite as in claim 17 wherein said composite is a strip.

19. A composite as in claim 18 further including a metallic foil bonded to at least one surface of the composite strip.

20. A composite as in claim 18 further including a continuous layer of low melting temperature glass coating on at least one surface of the composite strip.

21. A composite as in claim 17 wherein said bonding agent is a glass.

22. A composite as in claim 17 wherein said bonding agent is an organic adhesive.

23. A composite as in claim 17 wherein said bonding agent is a ceramic.

24. A composite as in claim 17 wherein said bonding agent is a metal.

* * * * *